US011336084B1

(12) United States Patent
Jouybari Moghaddam et al.

(10) Patent No.: US 11,336,084 B1
(45) Date of Patent: May 17, 2022

(54) SENSITIVE IMPEDANCE-BASED STRING PROTECTION OF MULTI-STRING AND MULTI-STAGE CAPACITOR

(71) Applicant: General Electric Company, Schenectady, NY (US)

(72) Inventors: Hessamoddin Jouybari Moghaddam, Markham (CA); Ilia Voloh, Markham (CA)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 17/105,945

(22) Filed: Nov. 27, 2020

(51) Int. Cl.
  *H02H 7/16* (2006.01)
  *H02H 3/40* (2006.01)
  *G01R 31/40* (2020.01)
  *G01R 31/64* (2020.01)

(52) U.S. Cl.
  CPC .............. *H02H 7/16* (2013.01); *G01R 31/40* (2013.01); *G01R 31/64* (2020.01); *H02H 3/40* (2013.01)

(58) Field of Classification Search
  CPC . H02H 7/16; H02H 3/40; G01R 31/40; G01R 31/64
  USPC ......................................................... 324/548
  See application file for complete search history.

(56) References Cited

U.S. PATENT DOCUMENTS

2005/0075806 A1\* 4/2005 Phansalkar ............... H02J 9/06
  702/63

\* cited by examiner

*Primary Examiner* — Farhana A Hoque
(74) *Attorney, Agent, or Firm* — Eversheds Sutherland (US) LLP

(57) ABSTRACT

A protection and monitoring system, device, and method for an electric power system, including a capacitor bank having multiple strings in each phase, voltage and current measuring devices, and relays to protect this capacitor bank. Each string can have multiple capacitor units and each unit can consist of multiple capacitor elements. The method may include: determining steady state operating condition using the obtained current and voltages, calculating and storing present time impedance value of each string into memory, calculating the string per unit impedance incremental quantity, detecting capacitor element failure based at least in part on this incremental quantity and calculating number of failed capacitor elements for each event, accumulating the number of failed capacitor elements, and performing a protection action when healthy capacitor elements are subject to an overvoltage limit. The method may be inherently immune or otherwise insensitive to capacitor variations due to aging, temperature change, instrument transformers errors, inaccuracy in data acquisition, and inherent manufacturing unbalance.

20 Claims, 7 Drawing Sheets

US 11,336,084 B1

SENSITIVE IMPEDANCE-BASED STRING PROTECTION OF MULTI-STRING AND MULTI-STAGE CAPACITOR

TECHNICAL FIELD

The present disclosure relates to power systems, and, more particularly to, systems, devices, and methods for sensitive impedance-based string protection of multi-string and multi-stage capacitor banks.

BACKGROUND

Conventional shunt capacitor banks can provide power factor correction and capacitive reactive compensation. These electric power system assets can help control reactive power flow through the system and further control voltages on the power system buses. Capacitor banks may be installed on the transmission, sub-transmission, and distribution power system buses in a power system, for example. When a capacitor bank is out of service due to failure, this may hinder reliable operation of the power system. Thus, the downtime of the capacitor bank should be as minimal as possible.

Capacitor banks can vary by type, configuration, size, and voltage level. IEEE standard IEEE C37.99 defines different capacitor bank types, configurations, and protection methods to protect shunt capacitor banks against failures. Capacitor banks can be constructed from multiple capacitor units connected in series and/or parallel, where each unit may have multiple capacitor elements. Because of the relative large number of the capacitor elements, IEEE standard C37.99 prescribes sensitive protection methods to detect capacitor element failures relatively early in order to mitigate problems with the remaining healthy capacitor elements, which can minimize the impact of capacitor element failures.

Most conventional capacitor banks are of the fuseless type, where capacitor cans are connected in series in multiple strings connected in parallel in each phase. Such systems may use current and voltage sensors to provide capacitor bank protection. Common protection practice is to measure each phase current. This however can impact protection sensitivity and can lead to protection misoperations.

Figure 1:
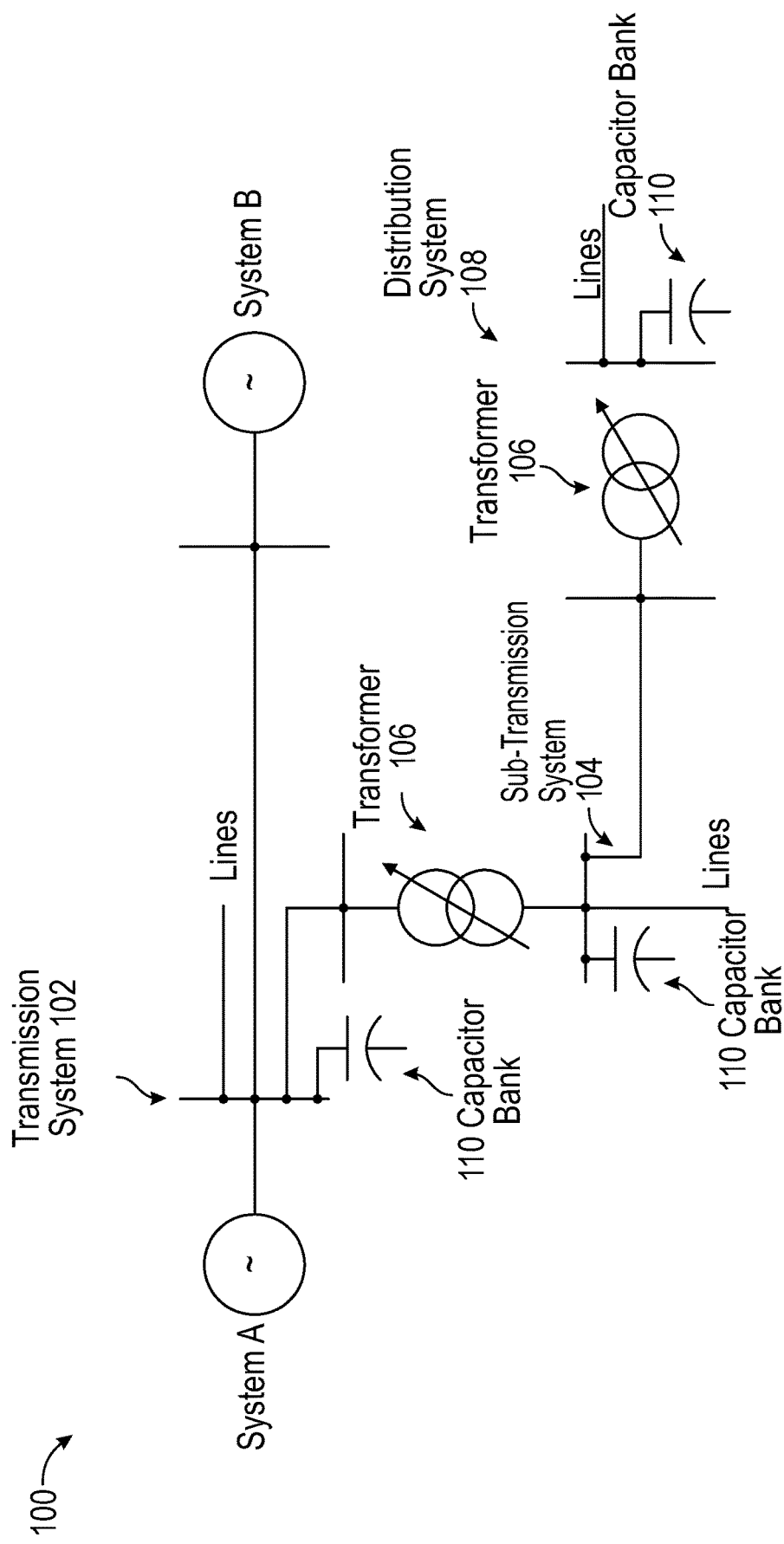
FIG. 1 depicts a schematic illustration of an example system, in accordance with one or more example embodiments of the disclosure.

The following detailed description is set forth with reference to the accompanying drawings described above. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

This disclosure may relate to, among other things, systems, devices, and methods for sensitive impedance-based string protection of multi-string and multi-stage capacitor banks. In some instances, such multi-string and multi-stage capacitor banks may be found in power systems, such as the example power system depicted in FIG. 1 (as well as any other power system). Capacitor units may include capacitor elements, and capacitor strings may be formed when capacitor units are connected in series, for example, from a phase connection to a neutral connection (these capacitor units, capacitor elements, and capacitor strings may be exemplified in FIGS. 2-3). To detect failure of one or more capacitor elements in each capacitor string and prevent healthy capacitor elements in the capacitor string from operating under continuous overvoltage, a sensitive protection method may be used. This protection method may be described in more detail below.

Figure 3:
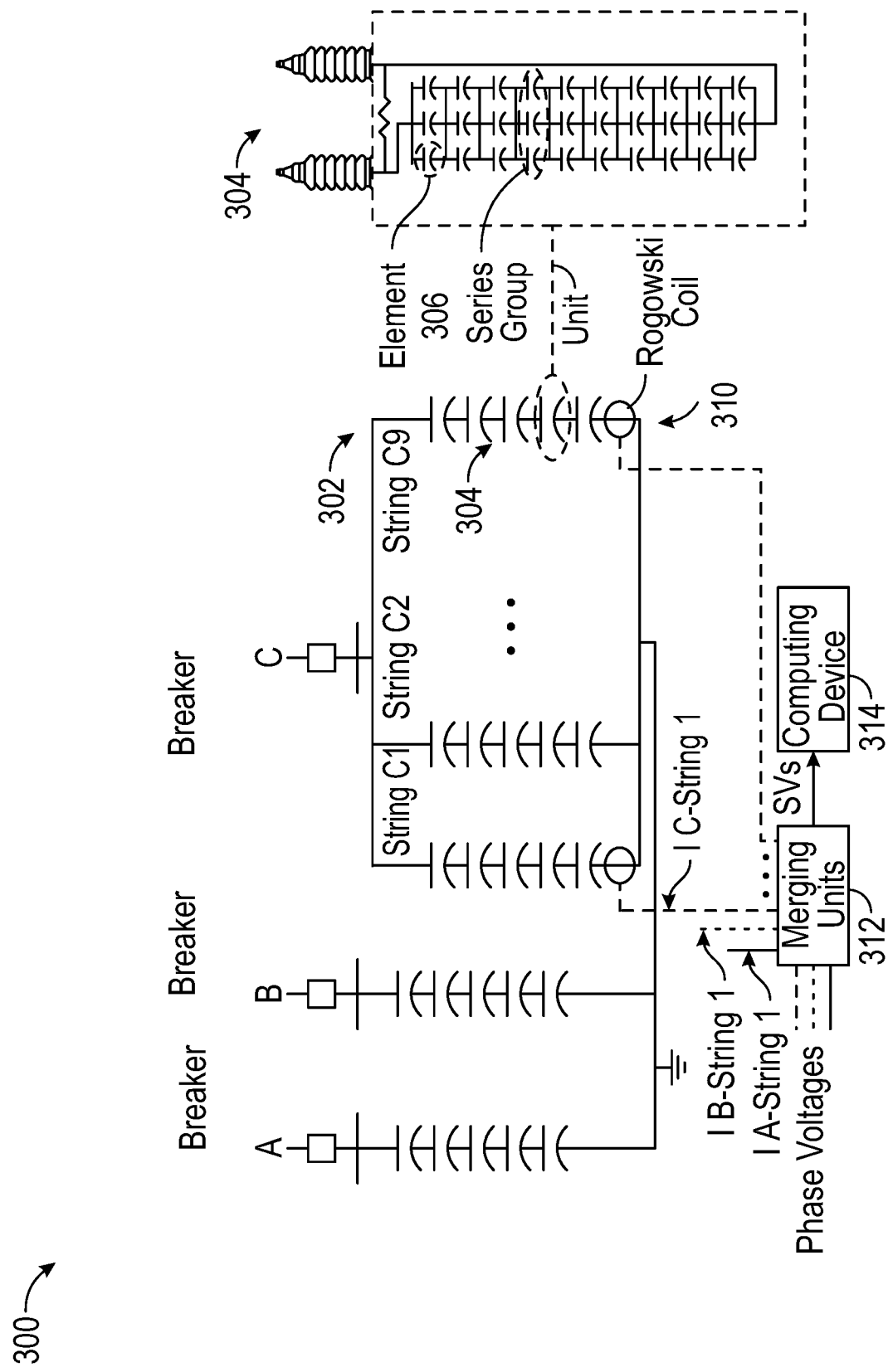
FIG. 3 depicts a schematic illustration of an example capacitor bank, in accordance with one or more example embodiments of the disclosure.

In some embodiments, a protection method may include initially obtaining capacitor string and unit design information. This can include, for example, capacitor unit ratings, such as nominal voltage and reactive power, as well as a number of series capacitor units in each string. This information may be available in capacitor bank drawings and specification documents in some instances. The method may also include obtaining phase voltage and string current data. The phase voltage and string current data may be obtained directly from current and/or voltage transducers or from sampled values from one or more merging units (for example, as depicted in FIG. 3). The merging units may be compliant to the IEC 61850 Standard and may provide conversion of analog to digital signals, with streaming of the sampled analog data from the merging unit to the protective relay via network for protection, control, and metering purposes.

Figure 2:
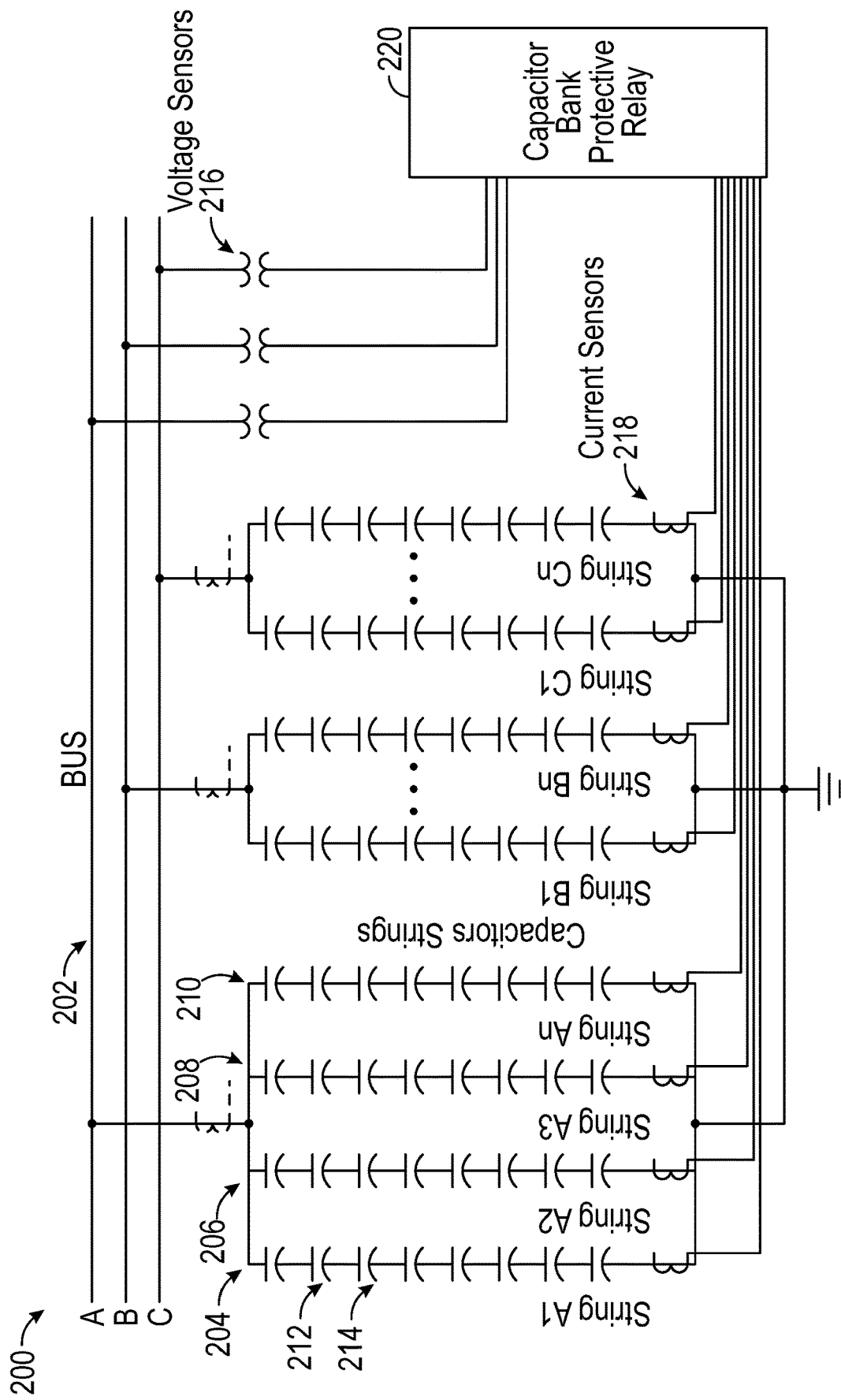
FIG. 2 depicts a schematic illustration of an example capacitor bank, in accordance with one or more example embodiments of the disclosure.

In some embodiments, once the phase voltage and string current information is obtained, the method may also include determining whether the obtained voltage and current data satisfies one or more steady state criteria. Power system steady state criteria may involve ensuring that the algorithm is not obtaining currents and voltages during power system disturbances not to impact method performance. One example of a steady state operating condition may include when a difference between present and previous measured magnitudes of the bus voltage not exceeding a threshold amount, for example, about 1%. As depicted in FIG. 2, the capacitor strings may be connected to the bus. When it is determined that the obtained voltage and current data satisfies one or more steady state criteria, the present time is deemed as a steady state operating condition and a string impedance value may be calculated and stored in memory (for example, the buffer depicted in FIG. 4). The string impedance value may include, for example, a magnitude of impedance derived from fundamental frequency phasors of voltage and current of the capacitor string. The string impedance value may represent impedance of the entire capacitor string, where phase to ground voltages and string currents can be used to calculate this impedance. The string impedance value may also be string per unit impedance based at least in part on nominal reactance of the capacitor string. Additionally, the memory may be in the form of, for example, a first in first out (FIFO) buffer of a predetermined size. For example, for executing X times per power cycle and covering a span of Y cycles, the buffer size may be suitable to store: (X times Y) impedance values for each string independently. The stored values might be from subsequent executions or have short time difference due to steady state condition supervision. Normally, values may be valid for calculation for some hours, but for maximum sensitivity the buffer can be erased if the gap in steady state time goes beyond a threshold period of time, such as about 20 seconds or any other threshold time.

In some embodiments, the present time string impedance value calculations may be performed when the obtained voltages and/or currents satisfy the steady state criteria to ensure that the string impedance value is calculated correctly, and that transients are not affecting the calculation of the string impedance. Power system transients can impact the accuracy of phasor measurement; therefore, it may be beneficial to reduce the impact of transients. This method may include measuring small changes in impedance, for example 2% or less, so it may be beneficial to measure impedance values precisely. For example, a system fault may cause a disturbance in fundamental frequency phasor calculations and it may be beneficial for such transients to be detected. Capacitor element failures may result in very slight changes in string current, for example a 2%, or less, change from the string current prior to the capacitor failure, but major faults, such as phase-to-phase arcing faults may result in significant changes in voltage and string current values. Therefore, a sensitive protection may be required for detecting the capacitor elements failure that may happen during steady state conditions.

In some embodiments, the steady state criteria may also include a range for string impedance. This may further block running the incremental quantity calculator when the measurements do not satisfy steady state bank operation criteria. For example, boundaries of the steady state impedance region can be determined on the basis of some or all of the following: maximum manufacturing tolerance for each capacitor string (this may be minimized in the process of choosing capacitor units for each string assembly), maximum temperature impact on capacitance, measurement errors, and/or maximum number of failures that are within the realm of the sensitive protective algorithm. An example of such tolerance bands from nominal capacitance reactance of the string may include about 0.5% for manufacturing tolerance, and about 3% for operation at high end (such as about +55° C.) or low end (such as about −55° C.) temperature boundaries. Furthermore, capacitor element failure protection methods look after minor internal faults that may not be able to be detected by other means and that is capacitor failures affecting less than about 10% of a string impedance. As a result, assuming worst case of all maximum tolerances on top of each other, a range may be defined for steady state operation of the capacitor bank. For maximum sensitivity to steady state conditions, the range for each capacitor string can be selected more restrictive individually, for example, by adjusting the steady state condition boundary after each failure is detected in the capacitor string.

In some embodiments, when a sufficient number of string impedance values are stored in the memory, the method may include calculating a per unit impedance incremental quantity for each capacitor string. This incremental quantity may be derived from the difference between the oldest string impedance value stored in the memory and the present time string impedance value stored in memory and may be in per-unit of the oldest value. For example, when storing the magnitude of the string impedance in the memory, the string per unit impedance incremental quantity may be:

$$Zop(n) = \frac{(|z_{buffer_{oldest}}| - |z_{buffer_{newest}}|)}{|z_{buffer_{oldest}}|} \quad \text{Equation 1}$$

For fuseless and unfused capacitor banks, the capacitor failure mode may include a short circuit. Therefore, a "decrease" in absolute value of the impedance may be a sign of capacitor element failure. Another variation of detection may be using the absolute value of the difference between the present string impedance value and the oldest string impedance value stored in the memory instead of the per-unit calculation shown above. Because the incremental quantity may be derived from stored string impedances that may all be recent records in the memory, the method may be inherently immune or otherwise insensitive to capacitor variations due to aging or temperature changes. Furthermore, because of operating based at least in part on the incremental quantity, the method may be inherently immune to inherent manufacturing unbalances and may be immune or otherwise insensitive to instrument transformers errors and inaccuracy in data acquisition.

In some embodiments, when it is determined that the per-unit impedance incremental quantity for a capacitor string exceeds a threshold, it may be a sign of a capacitor element failure in the capacitor string. Assuming a capacitor element has failed, then a most recent data entry stored in the memory (for example, a FIFO buffer) may include a stored impedance value for capacitor failure moment. The per-unit difference between per-unit impedance values stored in memory before the time of the detected capacitor element failure and the per-unit impedance value stored in memory at and after the time of the detected capacitor element failure may be above the threshold. The threshold may be predetermined, for example, using the number of series capacitor elements in the string. This can be calculated by a user or automatically, for example, using below reference value by the protective device:

$$Zop\_pkp = 1/(N \times n) p.u. \quad \text{Equation 2,}$$

where N may be a number of series capacitor elements in the string and n may be the number of capacitor elements (or equivalently series groups) in each capacitor unit per the design of the capacitor bank. In practice, thresholds should be set below this reference, for example, about 80%-90% of its value.

For higher security, the method may wait until the incremental quantity is above a threshold for a time delay. For example, this may include a number of subsequent executions. Once the security time delay has passed, a capacitor failure is indicated by the protective device and the number of failed capacitor elements, or equivalently series groups, can be calculated. For example, when the base value for per-unit incremental quantity is the memory oldest value, one can convert the per-unit incremental quantity value to number of failed capacitor elements by finding the nearest integer to:

$$N\_Failure = Zop \times \times (N \times n) \quad \text{Equation 3,}$$

where, N_Failure denotes the calculated number of failed capacitor elements and (N×n) represents total number of series capacitor elements in the string, that may be the number of series capacitor units in the capacitor string (N), times the number of capacitor elements (or equivalently series groups) in each capacitor unit (n), per the design of the capacitor bank. In Equation 3, (N×n) can also be compensated for higher accuracy, for example, where previous cumulative number of failed capacitor elements is available, it can be subtracted from (N×n) to account for previously detected failed capacitor elements. A capacitor element failure event may be indicated and then the cumulative number of failed capacitor elements may be further accumulated and stored in the memory. The stored cumulative number of failed capacitor elements value may be equal to its past value plus the new detected event's number of failed capacitor elements. When protecting a capacitor bank for the first time, the method may obtain a known number of failed capacitor elements. The value can then be written as the initial record value for the cumulative number of failed capacitor elements. Furthermore, the method may update the memory values with the value used for calculating the number of failed capacitor element. For example, if only a present Zop value was used for this purpose, then the present impedance value that is indicative of a failed capacitor element state may be written to all memory records of that capacitor string. In such a case, the memory may include all values indicative of a capacitor element failure. This way one can set the security time delays for detection to any time less than the memory duration (time span covered by the buffer when steady state condition is continuous). Further, dependent on what value is chosen for Zop in Equation 3 (whether an average of recent values or the present value), if another failure has impacted the real-time buffer it may be counted towards number of failed capacitor elements only once.

When the healthy capacitor elements are subject to overvoltage limit, a protection action, such as disconnecting the capacitor bank, may be performed. The decision may be based at least in part on the accumulated number of failed capacitors, or similar quantities, such as accumulated failed impedance percentage, or any other equivalent measure of the voltage stress over the remainder healthy capacitors. For example, an overvoltage quantity can be calculated per below equation:

$$OV\% = [(N \times n)/(N \times n - ACC\_N\_Failure)] \times 100\% \quad \text{Equation 4,}$$

where, N×n may be the total series capacitor elements in the capacitor string, as explained above, and ACC_N_Failure may be the cumulative number of failed capacitor elements. Usually when the continuous operating voltage exceeds about 110%, the capacitor bank may be taken out of service for maintenance (for example, replacement of the capacitor units that have the failed capacitor elements). The protection action threshold may, for example, also include whenever the accumulated number of failed capacitor elements equals to or exceeds the number of elements (or series groups of elements) within a unit. Such a condition can be indicative of a capacitor unit terminal-to-case fault. After replacement of faulty capacitor units, the accumulated number of failed capacitor elements records may be cleared from the memory accordingly. The operating characteristic of the method may be shown in an incremental quantity plane (impedance axes) in FIG. 5, for example. The threshold used for detection of capacitor failures by the string per unit impedance incremental quantity may be shown as the most inner circle around the origin. The accumulated number of failed capacitor elements quantity (or its equivalents) may be mapped to the same plane as shown by the dashed circle. Same mapping can be done for the protection action threshold or other similar threshold such as one for visual indicator activation when reaching a warning level in the overvoltage.

Illustrative System

Turning back to FIG. 1, an example system 100, in accordance with one or more embodiments of this disclosure, is shown. The system 100 may depict an example power system in which the capacitor banks including the strings of capacitor units that are described herein may be included. In some embodiments, the system 100 may include at least transmission system 102, a sub transmission system 104, one or more transformers 106, and one or more distribution system lines 108. The system 100 may also include one or more capacitor banks 110 as described herein, such as, for example, in the transmission system 102 and/or the sub transmission system 104. The capacitor banks 110 may similarly be located at any other portion of the example system 100 as well. The capacitor banks 110 may provide power factor correction and capacitive reactive compensation. The capacitor banks 110 may be important electric power system assets that are required to control reactive power flow through the system 100 and to control voltages on the power system buses.

FIGS. 2-3 depict schematic illustrations example capacitor bank 200 and capacitor bank 300 respectively. The capacitor bank 200 may exemplify the capacitor banks 110 depicted in the system 100 of FIG. 1, as well as any other capacitor bank described herein. In some embodiments, the capacitor bank 200 may include one or more capacitor strings (for example, capacitor string 204, capacitor string 206, capacitor string 208, capacitor string 210, as well as any other number of capacitor strings). The capacitor strings may include one or more capacitor units (for example, the capacitor string 204 may include capacitor units 212, 214, . . . N, as well as any other number of capacitor units. The capacitor units may, in turn, include one or more capacitor elements, which may be further depicted in FIG. 3 described below. Capacitor strings in the capacitor bank 200 may be connected to a bus 202. In some instances, the capacitor bank 200 may also include one or more sensors used to capture data pertaining to the operation of the capacitor units, capacitor strings, or individual capacitor elements. For example, the capacitor bank 200 may include one or more voltage sensors 216 and/or one or more current sensors 218, as well as any other types of sensors. The capacitor bank 200 may also be equipped with one or more protective relays 220, which may be used to protect the capacitor bank in the event of a capacitor element failure.

In some embodiments, capacitor bank 300 depicted in FIG. 3 may be similar to capacitor bank 200 depicted in FIG.

2. For example, capacitor bank 300 may include one or more capacitor strings (for example, capacitor string 302), which, in turn, may include one or more capacitor units (for example, at least capacitor unit 304). FIG. 3 may also depict a more detailed depiction of an example capacitor unit 304 as including one or more capacitor elements (for example, capacitor element 306). Additionally, as depicted in the figure, the capacitor elements in a capacitor unit may be formed into groups, such as series group 308. The purpose of series grouping may be to achieve capacitive reactive power rating of the unit. Capacitor bank 300 may also differ from capacitor bank 200 in that capacitor bank 300 may include one or more Rogowski Coils 310, one or more merging units 312 and/or computing device 314. A Rogowski coil is a toroid of wire used to measure an alternating current through a cable encircled by the toroid. The Rogowski coil is beneficial because of small size and convenience of installation for capacitor bank string current measurement. The output signal of the Rogowski coils may be used by the merging units to provide measured current in IEC 61850 compliant sampled values. The computing device 314 may include a protective relay with a processing module to use the acquired sampled values for running the capacitor string protection method and, eventually, initiating the protection action when needed.

Figure 4:
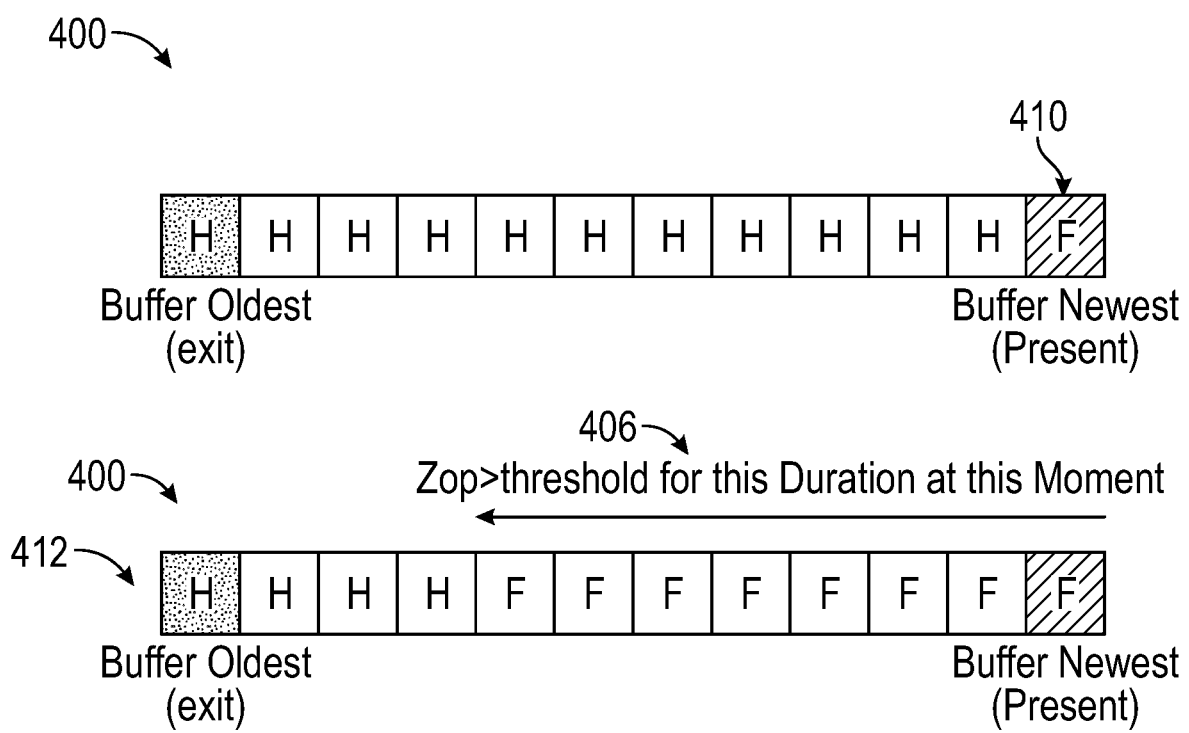
FIG. 4 depicts an example memory during operations of the methods described herein, in accordance with one or more example embodiments of the disclosure.

FIG. 4 depicts an example of the contents of the memory 400 (for example, a FIFO buffer) during the methods described herein. As depicted in the figure, memory entries including the letter "H" may be stored impedance values for before a capacitor failure moment, and memory entries including the letter "F" may be stored impedance values at and after the time of a capacitor failure moment. It should be noted that the use of the letters "H" and "F" are merely for illustrative purposes, and the actual data that is stored in memory may instead include impedance or other values. In some embodiments, when it is determined that the per-unit impedance incremental quantity for a capacitor string exceeds a threshold, it may be a sign of a capacitor element failure in the capacitor string. Assuming a capacitor element has failed, then a most recent data entry 410 stored in the memory 400 may include a stored impedance value for capacitor failure moment (as may be shown by the letter "F" being included in the most recent data entry 410 in the memory 400. The per-unit difference between per-unit impedance values stored in memory before the time of the detected capacitor element failure and the per-unit impedance value stored in memory at and after the time of the detected capacitor element failure may be above the threshold. The threshold may be predetermined, for example, using the number of series capacitor elements in the string. This can be calculated by a user or automatically, for example, using Equation 2 above.

Continuing with FIG. 4, for higher security, the method may also wait until the incremental quantity is above a threshold for a time delay. This may be depicted in memory state 412. For example, this may include a number of subsequent executions. Once the security time delay has passed, a capacitor failure may be indicated by the protective device and the number of failed capacitor elements, or equivalently series groups, can be calculated. For example, when the base value for per-unit incremental quantity is the memory oldest value, one can convert the per-unit incremental quantity value to number of failed capacitor elements by finding the nearest integer, for example, by using Equation 3 above. A capacitor element failure event may be indicated and then the cumulative number of failed capacitor elements may be further accumulated and stored in the memory. 400. The stored cumulative number of failed capacitor elements value may be equal to its past value plus the new detected event's number of failed capacitor elements. When protecting a capacitor bank for the first time, the method may include obtaining a known number of failed capacitor elements. The value can then be written as the initial record value for the cumulative number of failed capacitor elements. Furthermore, the method may include updating the memory values with the value used for calculating the number of failed capacitor element. For example, if only a present Zop value was used for this purpose, then the present impedance value that is indicative of a failed capacitor element state may be written to all memory records of that capacitor string. In such a case, the memory may include all values indicative of a capacitor element failure. This way one can set the security time delays for detection to any time less than the memory duration (time span covered by the buffer when steady state condition is continuous). Further, dependent on what value is chosen for Zop in Equation 3 (whether an average of recent values or the present value), if another failure has impacted the real-time buffer it may be counted towards number of failed capacitor elements only once.

Figure 5:
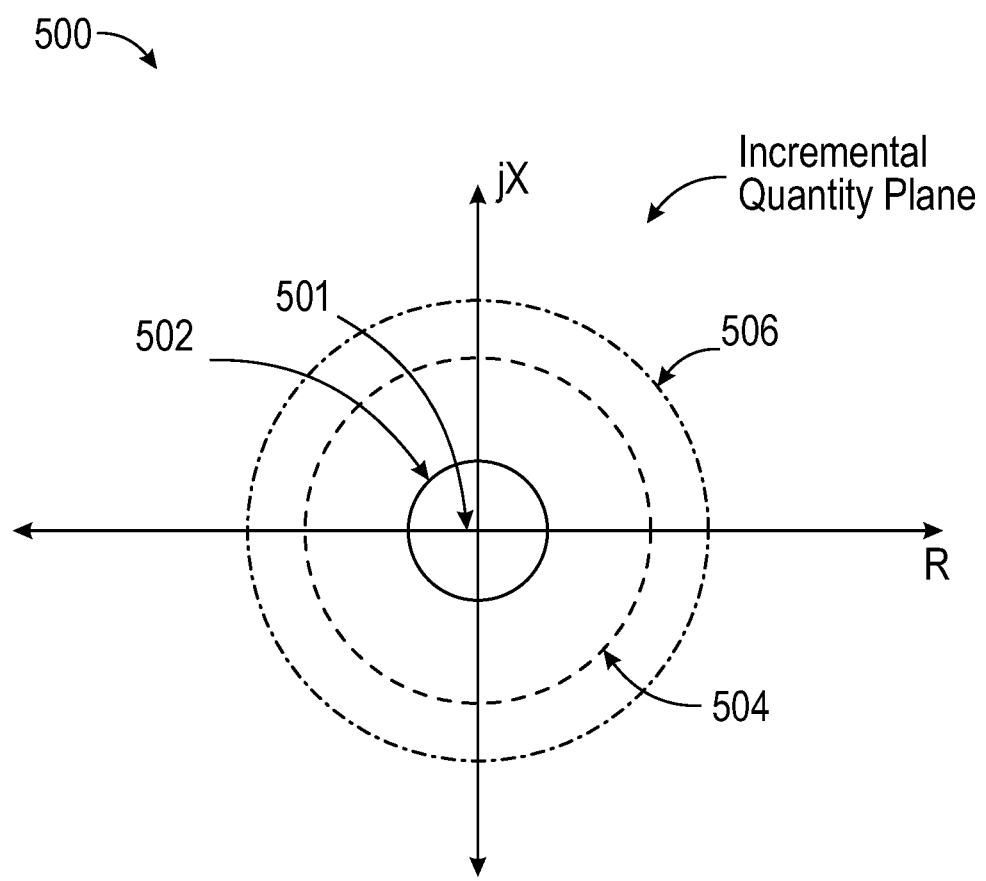
FIG. 5 depicts an example visualization of a protection method operating characteristics, in accordance with one or more example embodiments of the disclosure.

FIG. 5 depicts an example visualization of operating characteristics of the methods described herein. Particularly, example operating characteristics of the method may be shown in an incremental quantity plane 500 (using impedance axes). Within the figure, the threshold used for detection of capacitor failures by the string per unit impedance incremental quantity may be shown as the most inner circle 502 around the origin 501. The accumulated number of failed capacitor elements quantity (or its equivalents) can be mapped to the same plane as shown by the dashed circle 504. Additionally, the same mapping may be performed for the protection action threshold or other similar threshold, such as one for visual indicator activation when reaching a warning level in the overvoltage. This may be depicted by the outermost dashed circle 506. In some cases, there may exist multiple of these outmost dashed circles 506 (that is, there may exist multiple levels of these thresholds).

Illustrative Methods

Figure 6:
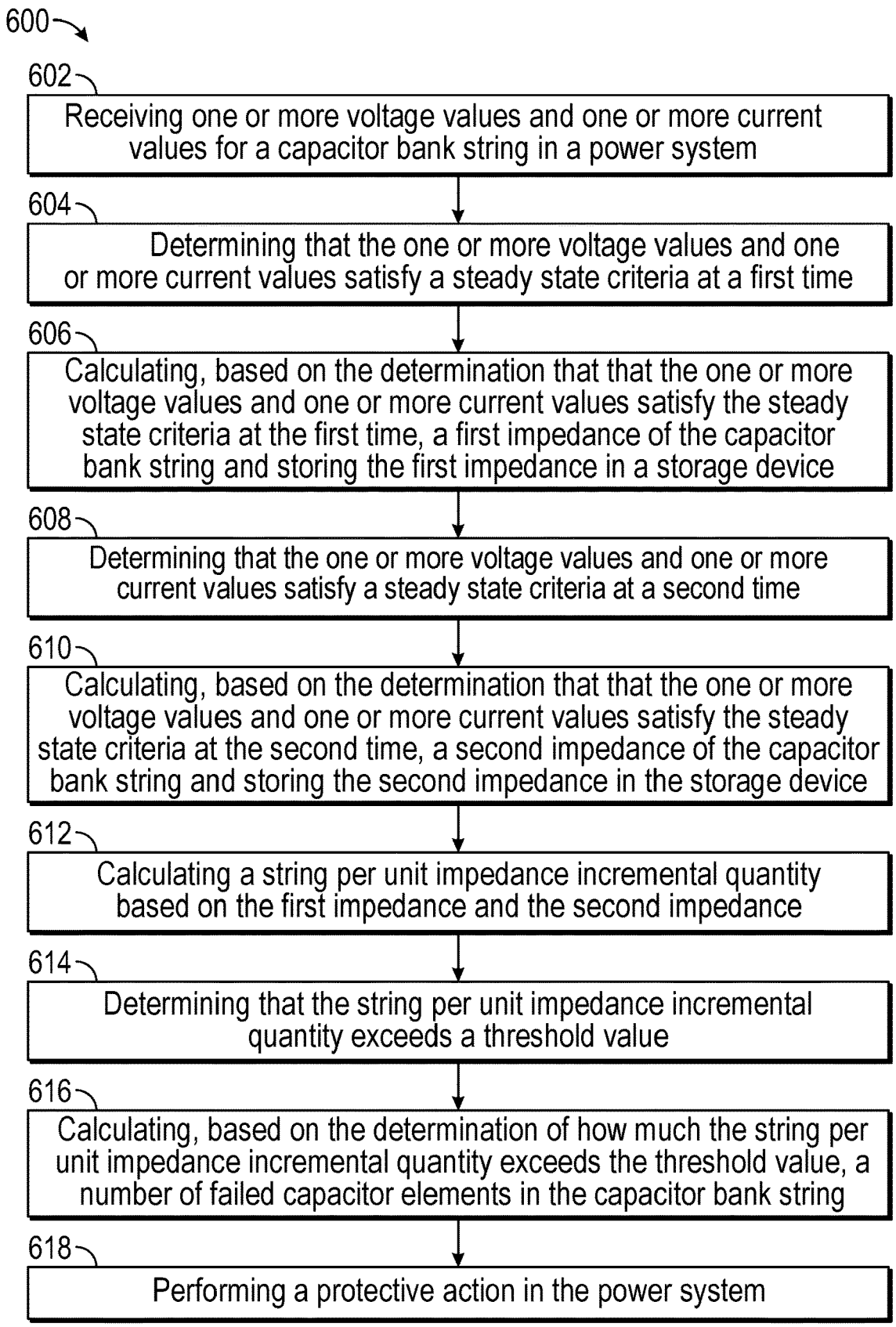
FIG. 6 depicts an example method in accordance with one or more example embodiments of the disclosure.

FIG. 6 is an example method 600 according to an example embodiment of the disclosure. At block 602 of the method 600 in FIG. 6, the method may include receiving one or more voltage values and one or more current values for a capacitor bank string in a power system. At block 604 of the method 600 in FIG. 6, the method may include determining that the one or more voltage values and one or more current values satisfy a steady state criteria at a first time. At block 606 of the method 600 in FIG. 6, the method may include calculating, based on the determination that that the one or more voltage values and one or more current values satisfy the steady state criteria at the first time, a first impedance of the capacitor bank string and storing the first impedance in a storage device. At block 608 of the method 600 in FIG. 6, the method may include determining that the one or more voltage values and one or more current values satisfy a steady state criteria at a second time. At block 610 of the method 600 in FIG. 6, the method may include calculating, based on the determination that the one or more voltage values and one or more current values satisfy the steady state criteria at the second time, a second impedance of the capacitor bank string and storing the second impedance in the storage device. At block 612 of the method 600 in FIG. 6, the method may include calculating a string per unit impedance incremental quantity based on the first impedance and the second impedance. At block 614 of the method 600 in FIG. 6, the method may include determining that the string per unit impedance incremental quantity exceeds a threshold value. At block 616 of the method 600 in FIG. 6, the method may include calculating, based on the determination of how much the string per unit impedance incremental quantity exceeds the threshold value, a number of failed capacitor elements in the capacitor bank string. At block 618 of the method 600 in FIG. 6, the method may include performing a protective action in the power system.

In some embodiments, the steady state criteria comprises a per unit incremental voltage magnitude being less than a threshold value, and wherein the steady state criteria further comprises an impedance region that is determined based at least in part on a reference impedance value for the capacitor string, and wherein the impedance region for the capacitor string is adjusted independently of an impedance region for a second capacitor string. In some embodiments, the memory can include a circular buffer, wherein calculating the string per unit impedance incremental quantity is further based at least in part on a determination that a threshold number of impedance values are stored in the memory, and wherein the threshold number of impedance values is based at least in part on the buffer being full since a previous erasing of the buffer. In some embodiments, the string per unit impedance incremental quantity can include a difference between an oldest impedance value stored in the memory and a current impedance value stored in the memory. In some embodiments, the threshold value is based at least in part on a number of capacitor elements in the capacitor string. In some embodiments, calculating the number of failed capacitor elements in the capacitor string is further based at least in part on a determination that a given number of successive string per unit impedance incremental quantities are how much greater than the threshold value. In some embodiments, performing the protection action is further based at least in part on determining an overvoltage on the remaining healthy capacitor elements in the capacitor string. In some embodiments, performing the protection action is further based at least in part on a predefined accumulated number of failed capacitors. In some embodiments, the one or more voltage values and one or more current values are obtained either directly from current and voltage transducers or from sampled values of a merging unit.

In some embodiments, the method 600 may further include reporting the number of failed capacitor elements in the capacitor bank string.

The operations described and depicted in the illustrative process flow of FIG. 6 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 6 may be performed.

Illustrative Computing System and Device

Figure 7:
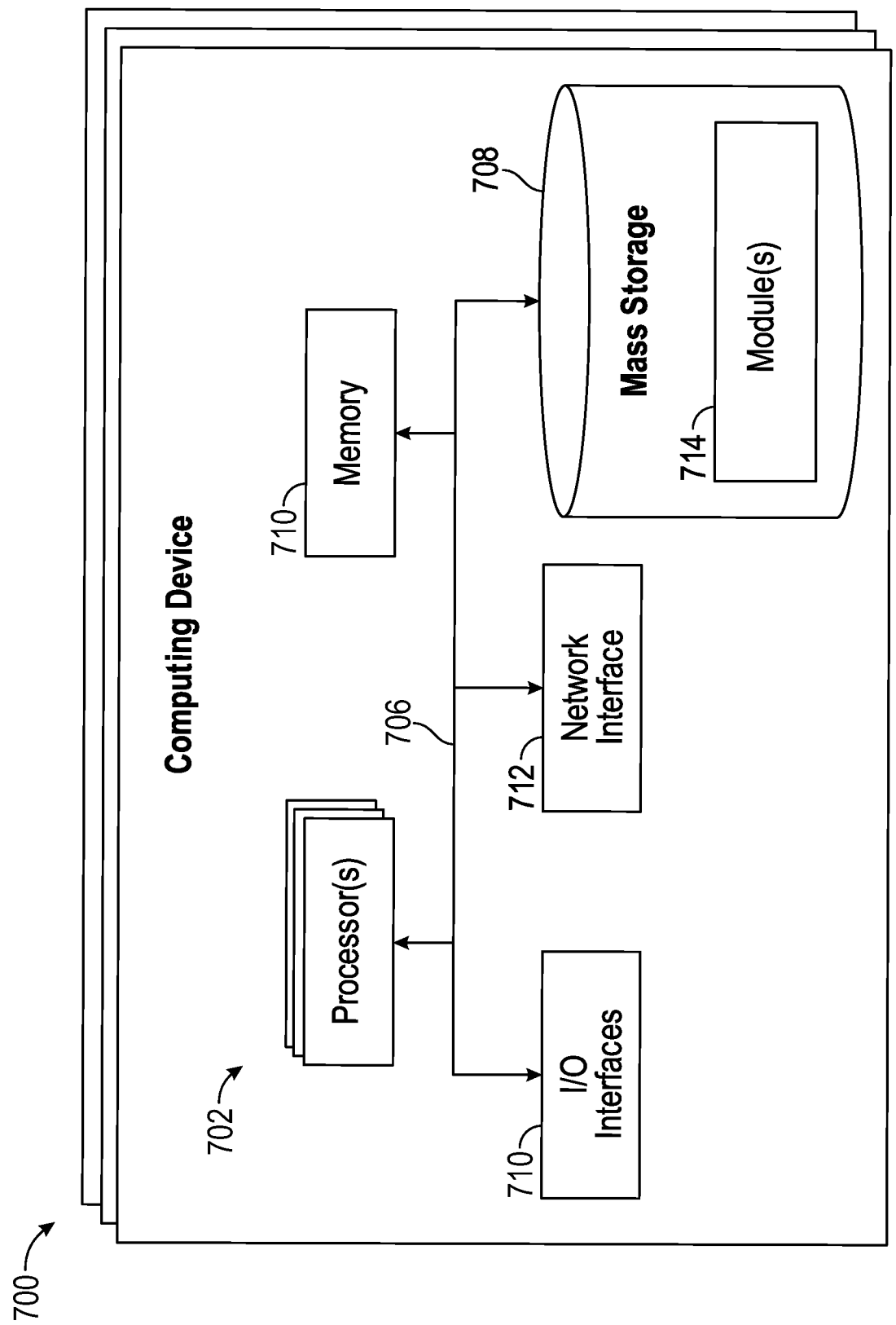
FIG. 7 depicts a schematic illustration of an example computing system and device architecture, in accordance with one or more example embodiments of the disclosure.

FIG. 7 illustrates an example computing system and device 700, in accordance with one or more embodiments of this disclosure. The computing device 700 may be representative of any number of elements described herein, such the gateway device 106, one or more remote devices 108, or any other element described herein. The computing device 700 may include one or more processors 702 that execute instructions that are stored in one or more memory devices (referred to as memory 704). The instructions can be, for instance, instructions for implementing functionality described as being carried out by one or more modules and systems disclosed above or instructions for implementing one or more of the methods disclosed above. The one or more processors 702 can be embodied in, for example, a CPU, multiple CPUs, a GPU, multiple GPUs, a TPU, multiple TPUs, a multi-core processor, a combination thereof, and the like. In some embodiments, the one or more processors 702 can be arranged in a single processing device. In other embodiments, the one or more processors 702 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 702 can access the memory 704 by way of a communication architecture 706 (e.g., a system bus). The communication architecture 706 may be suitable for the particular arrangement (localized or distributed) and types of the one or more processors 702. In some embodiments, the communication architecture 706 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 704 also can retain data.

Each computing device 700 also can include mass storage 708 that is accessible by the one or more processors 702 by means of the communication architecture 706. The mass storage 708 can include machine-accessible instructions (e.g., computer-readable instructions and/or computer-executable instructions). In some embodiments, the machine-accessible instructions may be encoded in the mass storage 708 and can be arranged in components that can be built (e.g., linked and compiled) and retained in computer-executable form in the mass storage 708 or in one or more other machine-accessible non-transitory storage media included in the computing device 700. Such components can embody, or can constitute, one or many of the various modules disclosed herein. Such modules are illustrated as asset monitoring and diagnostic modules 714.

Execution of the asset monitoring and diagnostic modules 714, individually or in combination, by the one more processors 702, can cause the computing device 700 to perform any of the operations described herein (for example, the operations described with respect to FIG. 5, as well as any other operations).

Each computing device 700 also can include one or more input/output interface devices 710 (referred to as I/O interface 710) that can permit or otherwise facilitate external devices to communicate with the computing device 700. For instance, the I/O interface 710 may be used to receive and send data and/or instructions from and to an external computing device.

The computing device 700 also includes one or more network interface devices 712 (referred to as network interface(s) 712) that can permit or otherwise facilitate functionally coupling the computing device 700 with one or more external devices. Functionally coupling the computing device 700 to an external device can include establishing a wireline connection or a wireless connection between the computing device 700 and the external device. The network interface devices 712 can include one or many antennas and a communication processing device that can permit wireless communication between the computing device 700 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 612 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A method comprising:
   receiving one or more voltage values and one or more current values for a capacitor bank string in a power system;
   determining that the one or more voltage values and one or more current values satisfy a steady state criteria at a first time;
   calculating, based on the determination that the one or more voltage values and one or more current values satisfy the steady state criteria at the first time, a first impedance of the capacitor bank string and storing the first impedance in a storage device;
   determining that the one or more voltage values and one or more current values satisfy a steady state criteria at a second time;
   calculating, based on the determination that the one or more voltage values and one or more current values satisfy the steady state criteria at the second time, a second impedance of the capacitor bank string and storing the second impedance in the storage device;
   calculating a string per unit impedance incremental quantity based on the first impedance and the second impedance;
   determining that the string per unit impedance incremental quantity exceeds a threshold value;
   calculating, based on the determination of how much the string per unit impedance incremental quantity exceeds the threshold value, a number of failed capacitor elements in the capacitor bank string; and
   performing a protective action in the power system.

2. The method of claim 1, wherein the steady state criteria comprises a per unit incremental voltage magnitude being less than a threshold value, and wherein the steady state criteria further comprises an impedance region that is determined based on a reference impedance value for the capacitor bank string, and wherein the impedance region for the capacitor bank string is adjusted independently of an impedance region for a second capacitor bank string.

3. The method of claim 1, wherein the storage device comprises a circular buffer, wherein calculating the string per unit impedance incremental quantity is further based on a determination that a threshold number of impedance values are stored in the storage device, and wherein the threshold number of impedance values is based on the circular buffer being full since a previous erasing of the circular buffer.

4. The method of claim 1, wherein the string per unit impedance incremental quantity comprises a difference between an oldest impedance value stored in the storage device and a current impedance value stored in the storage device.

5. The method of claim 1, wherein the threshold value is based on a number of capacitor elements in the capacitor bank string.

6. The method of claim 1, wherein calculating the number of failed capacitor elements in the capacitor bank string is further based on a determination that a given number of successive string per unit impedance incremental quantities are greater than the threshold value.

7. The method of claim 1, further comprising, reporting the number of failed capacitor elements in the capacitor bank string.

8. The method of claim 1, wherein performing the protection action is further based on determining an overvoltage on the remaining healthy capacitor elements in the capacitor bank string.

9. The method of claim 1, when number of failed capacitor elements is less than pre-defined number of failed elements causing overvoltage, this number is stored for further accumulation until the cumulative number exceeds the predefined threshold for protective action.

10. The method of claim 1, wherein the one or more voltage values and one or more current values are obtained either directly from current and voltage transducers or from sampled values of a merging unit.

11. A system comprising:
   at least one processor; and
   at least one storage device for storing computer-executable instructions, that when executed by the at least one processor, cause the at least one processor to:
      receive one or more voltage values and one or more current values for a capacitor bank string in a power system;
      determine that the one or more voltage values and one or more current values satisfy a steady state criteria at a first time;
      calculate, based on the determination that the one or more voltage values and one or more current values satisfy the steady state criteria at the first time, a first impedance of the capacitor bank string and storing the first impedance in a storage device;
      determine that the one or more voltage values and one or more current values satisfy a steady state criteria at a second time;
      calculate, based on the determination that the one or more voltage values and one or more current values satisfy the steady state criteria at the second time, a second impedance of the capacitor bank string and storing the second impedance in the storage device;

calculate a string per unit impedance incremental quantity based on the first impedance and the second impedance;

determine that the string per unit impedance incremental quantity exceeds a threshold value;

calculate, based on the determination of how much the string per unit impedance incremental quantity exceeds the threshold value, a number of failed capacitor elements in the capacitor bank string; and perform a protective action in the power system.

12. The system of claim 11, wherein the steady state criteria comprises a per unit incremental voltage magnitude being less than a threshold value, and wherein the steady state criteria further comprises an impedance region that is determined based on a reference impedance value for the capacitor bank string, and wherein the impedance region for the capacitor bank string is adjusted independently of an impedance region for a second capacitor bank string.

13. The system of claim 11, wherein the memory comprises a circular buffer, wherein calculating the string per unit impedance incremental quantity is further based on a determination that a threshold number of impedance values are stored in the storage device, and wherein the threshold number of impedance values is based on the circular buffer being full since a previous erasing of the circular buffer.

14. The system of claim 11, wherein the string per unit impedance incremental quantity comprises a difference between an oldest impedance value stored in the memory and a current impedance value stored in the storage device.

15. The system of claim 11, wherein the threshold value is based on a number of capacitor elements in the capacitor bank string.

16. The system of claim 11, wherein calculating the number of failed capacitor elements in the capacitor bank string is further based on a determination that a given number of successive string per unit impedance incremental quantities are greater than the threshold value.

17. The system of claim 11, further comprising, reporting the number of failed capacitor elements in the capacitor bank string.

18. The system of claim 11, wherein performing the protection action is further based on determining an overvoltage on the remaining healthy capacitor elements in the capacitor bank string.

19. The system of claim 11, when number of failed capacitor elements is less than pre-defined number of failed elements causing overvoltage, this number is stored for further accumulation until the cumulative number exceeds the predefined threshold for protective action.

20. The system of claim 11, wherein the one or more voltage values and one or more current values are obtained either directly from current and voltage transducers or from sampled values of a merging unit.

* * * * *